United States Patent
Holloway et al.

(10) Patent No.: US 7,692,116 B1
(45) Date of Patent: Apr. 6, 2010

(54) LASER ABLATION FOR THE SYNTHESIS OF CARBON NANOTUBES

(75) Inventors: Brian C. Holloway, Williamsburg, VA (US); Peter C. Eklund, Boalsburg, PA (US); Michael W. Smith, Newport News, VA (US); Kevin C. Jordan, Newport News, VA (US); Michelle Shinn, Newport News, VA (US)

(73) Assignee: Jefferson Science Associates, Newport News, VA (US)

( * ) Notice: Subject to any disclaimer, the term of this patent is extended or adjusted under 35 U.S.C. 154(b) by 1904 days.

(21) Appl. No.: 10/188,525

(22) Filed: Jul. 3, 2002

(51) Int. Cl.
*B23K 26/12* (2006.01)

(52) U.S. Cl. .................. 219/121.86; 219/121.84; 219/121.6

(58) Field of Classification Search ............ 219/121.86, 219/121.6, 121.68, 121.84, 121.85
See application file for complete search history.

(56) References Cited

U.S. PATENT DOCUMENTS

| | | | | |
|---|---|---|---|---|
| 5,300,203 A * | 4/1994 | Smalley | ................. | 204/157.41 |
| 5,591,312 A * | 1/1997 | Smalley | ................. | 204/157.41 |
| 6,077,401 A * | 6/2000 | Fields et al. | ........... | 204/157.47 |
| 6,312,768 B1 * | 11/2001 | Rode et al. | ................. | 427/596 |
| 6,558,757 B1 * | 5/2003 | Scheibe et al. | ............. | 427/569 |
| 6,645,455 B2 * | 11/2003 | Margrave et al. | ......... | 423/447.1 |
| 6,749,827 B2 * | 6/2004 | Smalley et al. | ........... | 423/447.3 |
| 6,855,659 B1 * | 2/2005 | Zhang | ....................... | 502/185 |
| 2002/0172767 A1 * | 11/2002 | Grigorian et al. | ...... | 427/255.28 |

\* cited by examiner

*Primary Examiner*—M. Alexandra Elve

(57) ABSTRACT

Single walled carbon nanotubes are produced in a novel apparatus by the laser-induced ablation of moving carbon target. The laser used is of high average power and ultra-fast pulsing. According to various preferred embodiments, the laser produces an output above about 50 watts/cm$^2$ at a repetition rate above about 15 MHz and exhibits a pulse duration below about 10 picoseconds. The carbon, carbon/catalyst target and the laser beam are moved relative to one another and a focused flow of "side pumped", preheated inert gas is introduced near the point of ablation to minimize or eliminate interference by the ablated plume by removal of the plume and introduction of new target area for incidence with the laser beam. When the target is moved relative to the laser beam, rotational or translational movement may be imparted thereto, but rotation of the target is preferred.

14 Claims, 2 Drawing Sheets

LASER ABLATION FOR THE SYNTHESIS OF CARBON NANOTUBES

The United States of America may have certain rights to this invention under Management and Operating Contract DE-AC05-84ER 40150 from the United States Department of Energy NASA Grant No. 301591; DOD DARPA/ARO Grant No. 334211; or NSF Grant No. 5-363388-A.

FIELD OF THE INVENTION

The present invention relates to the synthesis of carbon nanotubes and more particularly to such synthesis utilizing ultra-fast pulse, high average power laser energy directed at a carbon target in relative motion with the laser.

BACKGROUND OF THE INVENTION

Since the first reports of the production of single-walled carbon nanotubes (hereinafter SWNT) in 1991 by researchers at NEC and IBM, a variety of synthesis routes have been developed to improve both the production rate and the fractional conversion of carbon feedstocks to SWNTs. Among the methods developed for this purpose, all of which are well known and well documented in the art are: Arc Discharge (AD); Pulsed Laser Vaporization (PLV); and Chemical Vapor Deposition (CVD). Much of the work with PLV techniques has been carried out at Rice University as reported by A. Thess et al. in Science 273, 483 (1996). While this work still represents, to the best of our knowledge, the state of the art in the production of high quality SWNTs, it must be noted that the production rates for the processes described by these researchers are only on the order of milligrams per hour. The results of this work and the application of the SWNTs thus produced indicate that there exist many applications for SWNTs, but only if adequately high production rates can be achieved while maintaining the quality of the SWNT, i.e. the integrity of the tube wall.

One such application is as reinforcement for lightweight polymeric structures, especially inflatable structures for use in outer space where in addition to the strength imparting properties of the SWNTs, their electrical conductivity provides a means of reducing static charge buildup on such devices. Other potential applications reside in the areas of hydrogen storage at "low", i.e. about atmospheric pressure, although debate still rages as to this application and in NEMS or nano electro-mechanical structures useful in, for example, quantum computing devices.

It has been demonstrated that the longer the SWNT the better its properties as a reinforcing agent. Similarly, it is highly desirable that the SWNT "bundles" be small to permit better dispersal in the foregoing reinforcement applications. According to evaluations of SWNTs produced in accordance with the work at Rice University their SWNTs are on the order of 3-5 µm in length and occur in bundles about 10-25 nm in length. Evaluation of SWNTs produced in accordance with the present invention are generally 4-10 µm in length and occur in bundles of from 4-18 nm in length, thus making them more desirable candidates for application in reinforcing applications.

Thus, while there exist numerous areas of potential and actual application for SWNTs, what has been, and is currently lacking, is a method for the production of SWNTs of high quality in sufficient quantities as to provide a reliable and adequate source of desirable raw material for the development and implementation of such applications.

OBJECTS OF THE INVENTION

It is therefore and object of the present invention to provide an apparatus and method for the production of single walled carbon nanotubes (SWNTs) of high quality in volumes adequate to provide a source of such materials for developmental and production applications.

It is another object of the present invention to provide such apparatus and process that are capable of producing high quality SWNTs at production rates that are measured in grams per hour rather than in the milligrams per hour production rates previously demonstrated in the prior art.

It is yet another object of the present invention to provide single walled carbon nanotubes that are generally longer than those produced in prior art processes and occur in smaller bundles than those described in the prior art to thereby enhance the dispersing and reinforcing characteristics of these materials.

SUMMARY OF THE INVENTION

As used herein, the term "a high average power laser" is intended to describe a laser capable of producing at least 50 watts of power, and the term "high average power laser system" is intended to describe a laser system, i.e. a laser and associated transmission equipment and devices, capable of delivering a laser beam of at least 50 watts per square centimeter to a target. The term "ultra-fast" is meant to describe a laser that produces a pulse of less than 10 picoseconds in duration. According to the present invention, SWNTs are produced in a novel apparatus and according to a novel process by the laser-induced ablation of a carbon target that is moving relative to the laser, i.e. either the target or the laser may be in motion, but they are in relative motion with each other. The laser used is of high average power and is ultra-fast pulsing. According to various preferred embodiments, the laser produces an output above about 50 watts/cm$^2$ at a repetition rate above about 15 MHz and exhibits a pulse duration below about 10 picoseconds. The carbon, carbon/catalyst target and the laser beam are moved relative to one another and a focused flow of preheated inert gas is introduced at approximately an angle to the path of the incident laser beam near the point of ablation to minimize or eliminate interference by the ablated plume by removal of the plume and introduction of new target area for incidence with the laser beam. Such application of a focused flow is referred to herein as "side pumping". When the target is moved relative to the laser beam, rotational and/or translational movement is imparted thereto, but rotation of the target is preferred.

DETAILED DESCRIPTION

Figure 1:
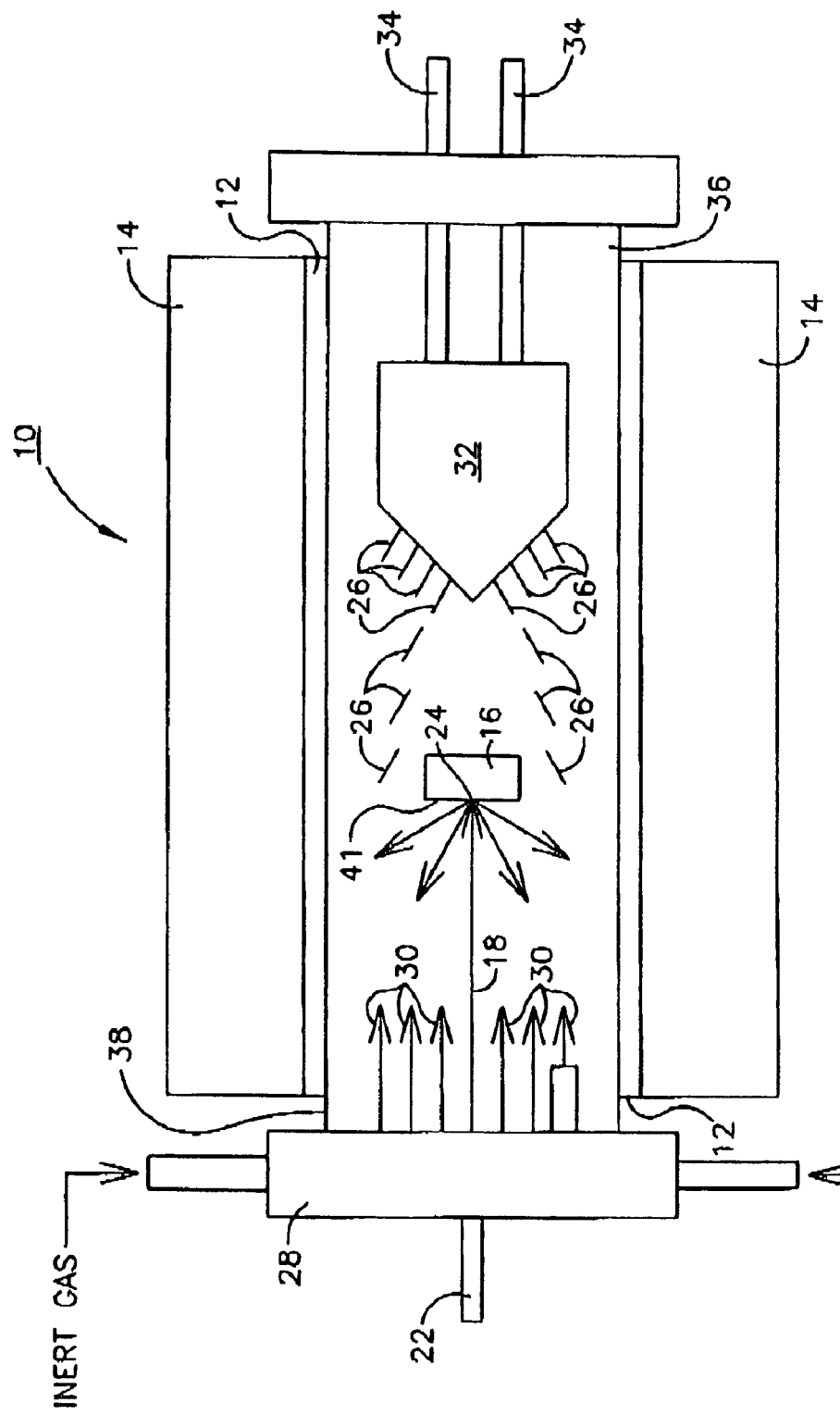
FIG. 1 is cut-away side view of a laser ablation SWNT production device of the prior art.

Referring now to FIG. 1 that depicts a cut-away side view of a prior art apparatus useful for the pulsed laser vaporization (PLV) technique for the production of SWNTs, the prior art device 10 comprised a quartz tube 12 surrounded by an annular furnace or heating element 14 that heats quartz tube 12 and its contents as described below to a temperature less than about 1200° C. Carbon/catalyst target 16 located inside of quartz tube 12 and laser 22 were moved relatively to each other while laser beam 18 produced by laser 22 impacted on target 16 at point 24 causing ablation of target 16 carbon with the concurrent formation of carbon nanotubes 26. Simultaneously with the action of the laser 22, an inert gas such as argon, argon/helium, xenon etc. is introduced through manifold 28 to provide a uniform flow of gas over the face of target 16 as shown by arrows 30 in FIG. 1. Carbon nanotubes 26 are collected on a water cooled copper collector 32 or finger fed by water lines 34 located in the end 36 of quartz tube 12 opposite end 38 that provides access to the interior of quartz tube 12 for laser 22 and gas flow 30. The geometry represented by the apparatus depicted in FIG. 1 is commonly referred to as a "front pumped counterflow PLV" geometry as opposed to the "side pumped" geometry of the present invention described below. While this apparatus and production method proved capable of producing SWNTs of adequate quality, the positioning of target 16 relative to the incoming laser beam 22 as well as the gas flow 30 against the incident surface 41 of target 16 resulted in "shadowing" effects wherein the incidence of laser beam 22 at point 14 was interrupted by the presence of plume or plume residue (not shown) which was apparently not adequately removed by gas flow 30. Similar apparatus and devices have been used to produce SWNTs in PLV systems using low power, less than about 30 watts/cm$^2$, and relatively long pulse durations, on the order of about 100 picoseconds or more, at production rates on the order of milligrams/hour. The foregoing is not intended to be an exhaustive description of such devices, but merely to serve as an example of one such prior art device that, while capable of intermittently producing SWNTs of satisfactory quality was only capable of producing such materials at production rates measured in milligrams/hour.

Figure 2:
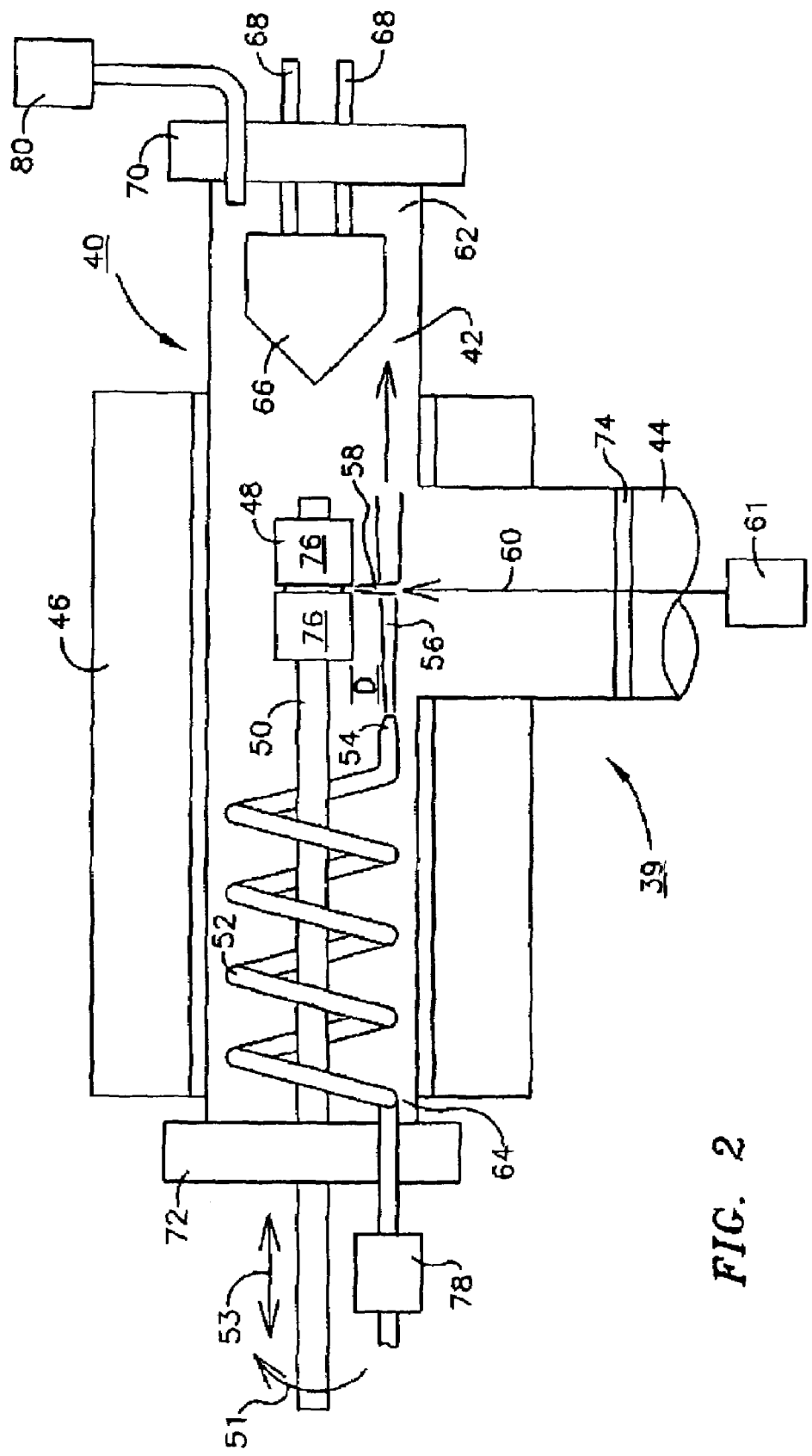
FIG. 2 is a cut-away side view of the laser ablation SWNT production device of the present invention.

Referring now to FIG. 2 that shows a cutaway schematic side view of the apparatus 39 of the present invention and useful in the successful practice of the method of the present invention, the apparatus 39 described herein comprises a generally "T-shaped" fused quartz growth chamber 40 comprising an operating chamber 42 and a laser beam access side arm 44. While the dimensions of either operating chamber 42 or side arm 44 are not particularly critical to the successful practice of the present invention, except as they provide suitable volume and access for the contained equipment described hereinafter, a dimension of about 50 mm diameter for operating chamber 42 and 25 mm for side arm 44 have been found to provide adequate volume in which to operate growth chamber 40. Operating chamber 42 is preferably surrounded by an annular furnace or heating element 46, although any other heating arrangement that provides the operating temperatures described hereinafter within operating chamber 42 can be used in the successful practice of the present invention.

According to the preferred embodiment of the apparatus 39 of the present invention depicted in FIG. 2, within operating chamber 42 are located: 1) a carbon or carbon/catalyst target 48 mounted on a shaft 50, shaft 50 being capable of rotational (arrow 51) or translational (arrow 53) movement through the action of an appropriate mechanical device (not shown); 2) an inert gas supply line 52 feeding; 3) a nozzle 54 that causes a flow of inert gas 56 to impinge generated plume 58 of ablated carbon, preferably at about a right angle (side pumped) to the direction of; 4) an incoming laser beam 60 provided through side arm 44 and produced by laser apparatus 61 that impacts surface 76 of target 48. Located at extremity 62 of operating chamber 42 opposite extremity 64 of operating chamber 42, that through which inert gas supply line 52 and shaft 50 enter operating chamber 42, is collector 66 that comprises a cooled surface upon which SWNTs generated in operating chamber 42 deposit. As described hereinabove in connection with the prior art device, collector 66 may simply comprise a water-cooled copper surface where water is introduced through supply lines 68. In the preferred embodiment depicted in FIG. 2, collector 66 is within operating chamber 42, but outside of annular furnace or heating element 46 for purposes of efficiency in cooling of collector 66. The construction and location of collector 66 are well known in the art and well within the capabilities of the skilled artisan to design.

Opposing extremities 62 and 64 of operating chamber 42 are closed by suitable closures 70 and 72 that provide access for the various previously described members that must access the interior of operating chamber 42. In the embodiment depicted in FIG. 2, closure 72 comprises a manifold such as that depicted at 28 in FIG. 1. In this embodiment, closure/manifold 72 provides a flow of gas in the manner described hereinabove and depicted in FIG. 1 for the operation of the chamber used in the prior art.

According to various preferred embodiments, shaft 50 is preferably fabricated from quartz to eliminate any possibility of interference with operation due to chemical interaction, warping etc., access to side arm 44 for laser beam 60 is provided through, for example, a CaF$_2$ window 74 in side arm 44 and gas supply line 52 is loosely, helically wound about shaft 50 to provide efficient preheating of inert gas supplied thereto. As will be obvious to the skilled artisan, alternative materials, e.g. ceramic for shaft 50 and equipment arrangements, heating of inert gas supply line 52 externally to operating chamber 42, are possible without in any way affecting the operational capabilities of the apparatus of the instant invention. Similarly, it is possible to obtain relative movement of laser beam 60 and target 48 through the use of mechanically driven mirrors that translate laser beam 60 over target 48 while target 48 is undergoing rotational and/or translational movement. What is important to the successful practice of the present invention is that a suitable carbon target be ablated through the action of an ultra fast and high average power laser in an apparatus and in a fashion that provides the laser beam uninterrupted access to the carbon, carbon/catalyst target and fast and efficient removal of the ablation plume from the field of view of the laser beam. The latter result is preferably obtained by "side pumping" the plume using a heated inert gas.

According to the preferred mode of operation, a cylindrical carbon target 48 incorporating as suitable metallic or metal carbide catalyst, as described below, is mounted on a quartz shaft 50 as shown in FIG. 2 and rotated and/or translated before ultra fast and high average power laser beam 60 while a flow of inert gas is passed through gas conduit 52 and out of nozzle 54. The ablation plume 58 caused by the action of laser beam 60 on target 48 is deflected (side pumped) by the action of gas flow 56 and SWNTs formed during the ablation process are deposited on collector 66 in conventional fashion.

Referring now to specific equipment requirements and process variables, growth chamber 40 and annular heating element are of conventional construction for quartz tube furnaces. Other means may be used to heat operating chamber 42, but whatever means is used for this purpose, it should be such as to be able to maintain a temperature above about 750° C., and preferably above about 1000° C., inside of operating chamber 42 during SWNT production.

Target 48 is of conventional composition and design for targets used in the fabrication of SWNTs. Such targets generally include metal or metal carbide incorporated directly into the target feedstock. Targets are generally formed by, among other methods, mixing graphite powder with amorphous pitch and a metal or metal carbide, slurrying this mixture in, for example alcohol or hexane, compressing to a desired shape, baking in a non-oxidizing atmosphere and then further compressing to the desired shape. Targets of this type are commercially available from Carbolex Inc., ASTeCC A020A, University of Kentucky, Lexington, Ky. 40506. Of particular utility at this time have been Ni—Y/graphite targets in an atomic composition of 1%:4%; 95%, Ni—Co/graphite targets in atomic compositions of 1%:4%:95% and 1%:1%:98% and Ni—Fe/graphite targets in atomic compositions of 1%:1%:98%. The particular target material used is not of critical importance to the successful practice of the present invention so long as it is capable of ablation to produce SWNTs. While the targets used in the development work have generally been about 1" in diameter, any suitable diameter that can be accommodated inside of an appropriate operating chamber 42 can be used. Target rotation speeds of about 1.7 Hz which translates to a translational speed of about 13.5 cm/s have been found adequate to produce the useful results described below in the apparatus and under the conditions specifically described herein. The particular rotational and translational speed of the target is not of particularly critical importance, except that it should not be synchronous with the pulse rate of the laser and cannot be too fast or too slow, but rather must be matched to the power, frequency, pulse rate etc of the laser being used. For example, synchronous movement can result in the laser beam impacting the same or nearly the same location on the target repeatedly, a condition that may defeat the use of a combination of relative target/laser movement and laser pulsing to eliminate localized heating as described below. If the target is spun or moved too quickly, the ablation threshold may not be reached, again depending upon the properties of the laser beam being applied. If the target is spun or moved too slowly, the ablation zone expands well beyond the confines of the laser spot (too large a heat affected zone) indicating thermal removal of material either by conduction through the target or radiation from the plume. Thus, while the specific movement direction and speed are not critical, these variables must be matched to the properties of the ablating laser beam to avoid the foregoing possible problems.

As previously described, collector 66 is of conventional construction, a water-cooled copper finger or the like. Collector 66 should, in accordance with conventional practice, be maintained at a temperature adequate to result in the deposition of SWNTs thereon. This temperature is generally below about 50° C. and preferably at about room temperature or 16-17° C. As previously mentioned, it is preferable to enhance the efficiency of collector 66 that while it is located within the confines of operating chamber 42 it be outside of the immediate area of heating element 46 or whatever other suitable heating system is used.

The inert gas introduced through gas supply line 52 may comprise any suitable inert gas such as argon, xenon, helium or the like or mixtures of such gases and selection of the inert gas is well within the capabilities and knowledge of the skilled artisan. So long as an inert environment is provided inside of operating chamber 42, the particular inert gas selected is not critical. As previously described, the inert gas introduced via supply line 52 and through nozzle 54 should be preheated to at or near the temperature of operating chamber 42 to avoid quenching SWNT growth. Although the mechanism for the formation of SWNTs is not fully understood, it is clear that the use of a gas whose temperature is significantly below that of operating chamber 42 adversely affects the production of SWNTs. Thus, a minimum temperature for the inert gas is about 750° C., although a minimum temperature of 1000° C. is preferred. The flow of gas that emerges through nozzle 54 must be a "high momentum flow", i.e. it must flow at a rate high enough to result in the continuous removal of plume 58 as it is formed to avoid shadowing surface 76 of target 48 from full exposure to laser beam 60. The use of a nozzle comprising a ~0.4 mm diameter hole located a distance D (see FIG. 2) of about 6 mm from surface 76 and upstream about 1 cm of the point where laser beam 60 strikes surface 76 has proven satisfactory in our evaluations. Any other suitable gas flow and nozzle arrangement that provides adequate plume removal without disrupting the formation of SWNTs can be similarly used. Also, while nozzle 54 is shown as directing the flow of inert gas 56 at a generally right angle to incident laser beam 60, it should be noted that although such right angle application of the inert gas is highly desirable, application of the inert gas at a "high momentum flow" and at any angle that results in the adequate evacuation of plume 58 is considered for purposes of the instant invention as "side pumping" of the heated inert gas relative to the direction of laser beam 60.

As previously mentioned, although the preferred method for heating of the inert gas is as shown in FIG. 2, supply line 52 encircling (helically wound about) shaft 50 within operating chamber 42, other means could be used to achieve the required heating of the inert gas internally or externally to operating chamber 42. Optionally some other tortuous path for gas supply line 52 could be provided within operating chamber 42, although the simplicity and neatness of the helical winding about shaft 50 is preferred.

Simultaneously with accomplishing "plume removal" as just described, the flow of inert gas is preferably adequate to maintain a pressure of inert gas that provides an inert environment within operating chamber 42. Of course, in a large operating chamber, a separate source of inert gas could be provided were the flow of inert gas in the side pumping operation not adequate to provide the desired inert environment. As shown in the Example below, in a 50 mm operating chamber 42 and using a nozzle 54 having a 4 mm outlet, a gas flow rate of 400 sccm at the exit from manifold 72 maintained such an atmosphere at 500 Torr. While this pressure may vary during operation, using these values for these variables resulted in relatively little pressure change during the SWNT production cycle, i.e. a pressure variation of generally less than about 10 Torr was observed although higher variations did occur. Such gas flow can of course be controlled using conventional methods such as an electronic flow controller 78 and a pressure controller 80 located through the extremities 70 and manifold 72 of operating chamber 42.

The final and perhaps most critical element in the apparatus and method described herein is the laser that provides the driving power for the high rate production of SWNTs as described herein. The laser must be ultra-fast and of high average power, i.e. capable of delivering to target 48 pulses below about 10, preferably less than about 5 and most preferably less than about 1 picoseconds in length at a power level above about 50 watts/cm$^2$ and preferably above about 100 watts/cm2. A preferred repetition rate is above about 50 MHz and preferably above about 60 MHz. The wavelength of the laser beam is not especially critical, although experience indicates that different wavelengths may affect the production rate of the process. For example, use of a 3 μm wavelength pulse resulted in a slightly higher SWNT production rate than that experienced using a 6 μm wavelength pulse. The application of such high power for such a short duration when combined with the relative movement between laser beam 60 and target surface 76 apparently minimizes the heat affected zone present in the target material thereby permitting the much higher SWNT production rates described herein. Of course the presence of the "side pumping" inert gas flow also contributes to these enhanced production rates by minimizing shadowing.

To our knowledge, the only laser system currently available for the generation of a laser beam as just described, ultra fast and of high average power, is the free electron laser. However, it is entirely possible that future developments in laser apparatus could provide an alternative laser system that could meet the foregoing requirements. For example, it may be possible to link a relatively large number of ultra fast solid state laser devices to obtain the high average power required.

EXAMPLE

The following example will serve to better illustrate the successful practice of the present invention.

To produce the results reported herein, the free electron laser (FEL) located at the Thomas Jefferson National Accelerator Facility, Newport News, Va. was operated at a repetition rate of 74.8 MHz, a pulse width of 0.5 picoseconds, a nominal wavelength of 3 μm and an average power of either 350 or 800 watts to power a device as described above. Power was continuously monitored, but because of transport mirror heating and degradation of power in the operating chamber, varied considerably with time. Since the capability did not exist to monitor power at the ablation point in real time, through the use of a power meter that showed an average transport loss of about 40% and by visualization of the ablation plume we estimated that the 350 and 500 watt operations delivered only about 200 and 500 watts at the ablation point respectively.

For the nominal 800 watt case, the beam was mechanically shuttered at a 14% duty cycle (1 second on, 6 seconds off) yielding an actual average power (after the 40% transport loss of about 70 watts of power per square centimeter. Power was reduced in the 800 watt case because of limits on the flow of hot argon to clear the plume and because of speed limitations on target motion that prevented optimal distribution of the laser heating. (Target heating was monitored with a CCD camera that viewed the ablation zone through the last FEL beam turning mirror, a hard reflector with about 50% transmission in the visible spectrum).

For the 800 watt case the production rate of nanotube soot was about 0.6 mg/sec or about 2.1 gm/hr during each 1 second burst of laser pulse. The actual long term average production rate was 280 mg/hour because of the 14% duty cycle. In the 350 watt case, the actual continuous production rate was 1.5 g/hr. Both of these rates are, of course, significantly higher than those reported in prior art processes.

The FEL beam was focused with a 50 cm focal length $CaF_2$ lens to a spot size of ~100 μm, yielding a peak laser flux of ~$5 \times 10^{11}$ W/cm$^2$, which is about 1000 times greater than the flux used in typical Nd:YAG based SWNT PLV systems previously reported. Such a tight focus was required to reach the target ablation threshold, as each FEL pulse was only $\frac{1}{200,000}^{th}$ as long as the typical 10 nanosecond Nd:YAG pulse and carried proportionately less energy. However, at 74.8 MHz the FEL pulses arrived every 13 nanoseconds delivering 7.5 million pulses for each single pulse delivered by the traditional 10 Hz Nd:YAG system.

From these evaluations, it was found that relative laser beam/target movement was important to successful production. Thus the rotation or translation speed in our test system shown in FIG. 2 was important. If the target was spun too quickly (only rotational movement of the target applied), the ablation threshold could not be reached. If the target was spun too slowly, the ablation zone expanded well beyond the confines of the laser spot, indicating thermal removal of material either by conduction through the target or radiation from the plume. By trial and error, a target rotation rate was found that gave a high cutting rate without producing collateral damage around the ablation point. In the work reported herein a revolution speed of 1.7 revolutions per second was used resulting in a translational speed of 13.5 cm/s.

Sample characterization was carried out using SEM, AFM, TEM, TPO and Raman scattering. SEM photomicrographs were taken using a JEOL-JSM 5400 operating at 20 KV. Samples were first coated with a thin film of gold to prevent charge accumulation. SEM images for carbon soot produced with Ni—Co and Ni—Y catalyst containing targets as described earlier show randomly oriented filaments (i.e. bundles) with an average diameter of 10 nm and several micrometers long. The bundles ranged from ~4-10 nm for Ni—Y derived tubes and from 4-18 nm for Ni—Co derived tubes. The metal content in the soot was determined by temperature programmed oxidation (TPO) to be almost the same as the composition of the target. The metal appears in low resolution TEM images primarily as carbon-coated metal particles 1 nm-15 nm in diameter. AFM was used to investigate the lengths of the SWNT bundles produced. Images collected with a Nanoscope III (Digital Instruments, Inc.) by dispersing the SWNT soot in ethanol with an ultrasonic horn (Misonix XL2020) for five minutes and then placing a drop of the ethanol suspension on a freshly cleaved mica substrate. When the ethanol had almost evaporated, the surface was blown dry with nitrogen gas. The AFM images showed that the bundles were quite long. Typical lengths were in the range of 5-20 microns. High resolution transmission electron microscopy was carried out in a JEOL 2010F device at 100 KV to minimize beam damage and to better reveal the structure of the SWNTs, nanocarbons and metal nanoparticles in the soots. The number of tubes within a typical bundle was found to vary from 8 to 200, although we observed many isolated SWNTs in soot produced with both catalysts.

From TEM, the individual tube diameter ranged from 1-1.4 nm. Occasionally, HRTEM images showed the presence of peapod structures. Fullerenic carbon shells are also observed outside of the SWNTs. None of the TEM images revealed the presence of double-walled nanotubes (DWNT) or multi-walled nanotubes (MWNT). In some of the TEM images, isolated SWNTs with perfectly hemispherical fullerenic caps can be seen.

Raman scattering spectra of the carbon soots can provide the molecular fingerprint of the SWNT. Since the electronic density of states of the SWNT is diameter dependent, different laser excitation frequencies excite tubes with different diameters (i.e. only a subset of the tubes can be excited with a single wavelength excitation). The spectra were taken on soots derived from Ni—Y and Ni—Co respectively; four different excitation wavelengths were used (1064 μm, 647 nm, 514.5 nm and 488 nm) to sample four different subsets of tubes in the samples. The visible Raman spectra were collected at room temperature in the backscattering configuration using a JY-ISA T6400 spectrometer with an Olympus BH3 confocal microscope (~1μ diameter focal spot), where as the IR Raman spectrum using 1064 nm excitation was taken with a BOMEM DA3+ FT-Raman spectrometer. Both spectrometers operated with a spectral slit width of less than 1 cm$^{-1}$.

The Raman spectra of SWNTs are well known to exhibit two strong first-order features: the radial displacement band (radial breathing mode), typically found in the region 140-300 cm$^{-1}$, depending on the SWNT diameter, and a tangential displacement band with maximum intensity near 1590 cm$^{-1}$ that is relatively independent of tube diameter. A somewhat broad, disorder-induced Raman band or "D-band" in $sp^2$ carbon is usually observed near 1350 $cm^{-1}$. This feature is very weak in our spectra; it's strength can either be identified with wall disorder in the SWNTs, scattering from carbon nanoparticles or due to the presence of a carbon coating on the outside of the tube bundles. The fact that the D-band is weak suggests that the fraction of the $sp^2$ carbon in forms other than SWNTs is low (i.e. multishell carbon particles) and that the wall disorder is also low. Using previously known relationships described by M. S. Dresselhaus, and P. C. Eklund in Advances in Physics 49, 705 (2000) it was determined that the diameter distributions of the Ni—Y and Ni—Co derived tubes, as revealed by their radial breathing mode frequencies are remarkably similar, consistent with the results from electron microscopy. Furthermore, the Raman line widths for both the radial and the tangential bands in both the Ni—Y and Ni—Co derived samples were comparable, another indication of similar wall integrity in both sets of samples.

Thus, in summary, electron microscopy and Raman Scattering both indicate that high quality SWNT bundles have been produced by ultra-fast ablation using a high power FEL. It was further shown, that SWNTs produced in the apparatus and according to the process described herein were generally, on average, longer and of generally smaller bundle size than those produced by prior art processes.

While performance of the process described herein has been largely in connection with the apparatus depicted in FIG. 2, it should be noted that any apparatus that provides the essential elements necessary to carry out the process of the instant invention could be equally useful. Thus any chamber of any configuration that provides mechanisms for: 1) the provision of a inert environment; 2) a moving graphite target; 3) ablationary access to the target by an ultra-fast and high average power laser; 4) side pumping of inert gas for removal of carbon plume formed by ablation; and 5) a suitable collector should also be interpreted as within the teachings of the present invention. Thus, for example, the operating chamber could comprise a relatively larger atmospherically controlled furnace that encompasses all of the required equipment to accomplish the high production rate process of the present invention.

As the invention has been described, it will be apparent to those skilled in the art that the same may be varied in many ways without departing from the spirit and scope of the invention. Any and all such modifications are intended to be included within the scope of the appended claims.

What is claimed is:

1. An apparatus for the high rate production of single-walled carbon nanotubes comprising:
    A) an operating chamber providing an inert environment;
    B) a mechanism for maintaining said operating chamber at elevated temperature;
    C) within said operating chamber a carbon or carbon/catalyst target;
    D) a laser producing a high average power, ultra-fast laser beam that impacts said target in said operating chamber to produce a plume of single-walled carbon nanotubes;
    E) a mechanism for imparting relative movement between said target and said laser beam;
    F) a mechanism for providing a high momentum, side pumped flow of heated inert gas that deflects said plume from the area where said laser beam impacts said target; and
    G) a collector for said single-walled carbon nanotubes.

2. The apparatus of claim 1 wherein said laser is a free electron laser.

3. The apparatus of claim 1 wherein said laser produces a laser beam having an average power above about 50 watts per square centimeter and a pulse duration below about 10 picoseconds.

4. The apparatus of claim 3 wherein said laser is a free electron laser.

5. The apparatus of claim 1 wherein said operating chamber is heated to a temperature about 750° C.

6. The apparatus of claim 5 wherein said operating chamber is heated to a temperature above 1000° C.

7. The apparatus of claim 1 wherein said target is cylindrical and mounted on a shaft, and said mechanism for imparting relative movement drives said shaft.

8. The apparatus of claim 1 wherein said mechanism for providing a high momentum, side pumped flow of heated inert gas comprises a gas supply line tortuously wound inside of said operating chamber to permit heating of said inert gas in said operating chamber.

9. The apparatus of claim 7 wherein said gas supply line is loosely helically wound about said shaft within said operating chamber.

10. The apparatus of claim 1 wherein said target comprises graphite and a metal catalyst.

11. The apparatus of claim 1 wherein said operating chamber comprises a quartz tube and further including a quartz tube side arm that provides access to said operating chamber for said laser beam.

12. The apparatus of claim 11 further including a generally annular heating element that provides the elevated temperature within said operating chamber.

13. The apparatus of claim 3 wherein said laser delivers a pulse below 5 picoseconds in duration.

14. The apparatus of claim 13 wherein said laser delivers a pulse below 1 picosecond in duration.

* * * * *